(12) United States Patent
Liu et al.

(10) Patent No.: US 7,560,774 B1
(45) Date of Patent: Jul. 14, 2009

(54) IC CHIP (75) Inventors: Chin-Hung Liu, Hsinchu County (TW); Chin-Lung Chen, Hsinchu County (TW); Ming-Tsung Tung, Hsinchu (TW); Wen-Kuo Li, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/018,638

(22) Filed: Jan. 23, 2008

(51) Int. Cl.
*H01L 29/76* (2006.01)

(52) U.S. Cl. .............. 257/343; 257/288; 257/E29.261

(58) Field of Classification Search ........... 257/342, 257/288, 343, 368, 392, 500, E29.256, E29.261
See application file for complete search history.

(56) References Cited

U.S. PATENT DOCUMENTS

| | | | |
|---|---|---|---|
| 6,313,508 B1 * | 11/2001 | Kobayashi | 257/351 |
| 7,180,132 B2 * | 2/2007 | Cai et al. | 257/342 |
| 7,329,570 B2 * | 2/2008 | Lee | 438/199 |
| 2004/0004263 A1 * | 1/2004 | Rothleitner | 257/500 |
| 2004/0079974 A1 * | 4/2004 | Lin et al. | 257/288 |
| 2008/0197408 A1 * | 8/2008 | Disney et al. | 257/335 |
| 2009/0020812 A1 * | 1/2009 | Cheng | 257/342 |

* cited by examiner

*Primary Examiner*—Thao X Le
*Assistant Examiner*—Mamadou Diallo
(74) *Attorney, Agent, or Firm*—J.C. Patents (57) ABSTRACT

An IC chip, including a switch LDMOS device and an analog LDMOS device, is configured on a substrate having a first conductive type. Components of the two LDMOS devices respectively include two gate conductive layers configured on two first active regions of the substrate. A common source contact region having a second conductive type is configured in a second active region, which is configured between the two first active regions. An isolation structure is included for isolating the second active region and the first active regions. The isolation structure between the first active regions and the second active region has a length "A" extending along a longitudinal direction of a channel under each gate conductive layer, and each gate conductive layer on each first active region has a length "L" extending along the longitudinal direction of the channel, the two LDMOS devices have different A/L values.

20 Claims, 5 Drawing Sheets

IC CHIP

BACKGROUND OF THE INVENTION

1. Field of Invention

The present invention relates to an integrated circuit chip.

2. Description of Related Art

Laterally double-diffused metal oxide semiconductor (LDMOS) is a power source device commonly used in semiconductor processes. A LDMOS can provide a higher breakdown voltage ($V_{bd}$) and has a lower on-resistance ($R_{on}$) during operation. Hence, LDMOS is normally used as a high voltage device in power management IC. The CMOS-DMOS-Bipolar device (CDMOS) process and the HV LDMOS analog process are the process platform for power management IC.

As electron products become more digitized and miniaturized, the demands for voltage accuracy, stability and battery durability increase. In a typical semiconductor factory, a single LDMOS process can provide a high voltage device with a single voltage rating. In other words, each type of voltage rating high voltage device requires one corresponding IC. Hence, even a high voltage device in power management IC requires to have different voltage ratings, for example, 40 volts, 30 volts and 18 volts, respectively, limited by the current processing technique, a typically power management IC can normally accommodates a high voltage device of a single voltage rating, for example, 40 volts. As the voltage rating of a high voltage device becomes higher, the area occupied of the voltage rating also becomes larger. Hence, if a typical power management IC demands for the application of a device using different voltage ratings, different integrated circuits are required. The device's dimension must increase, which leads to a higher production cost.

Moreover, a LDMOS can be used as a switch device or an analog device. Normally, a switch device requires the generation of a sufficient current only in a split second of time to achieve the opening-and-closing function. However, an analog device requires a stable current for a longer period of time to avoid any a misinterpretation of a signal. Since the characteristic requirements for a switch device and an analog device are different, only a switch device or an analog device can be fabricated in a typical single LDMOS fabrication process, and a LDMOS that can concurrently accommodate the characteristic requirements of both a switch device and an analog device can not be achieved.

Accordingly, limited by the current process, a single IC chip that includes a LDMOS having only a single characteristic feature or a single voltage rating is restricted in its application. Further, the occupation of a large chip area by a single IC chip that includes a LDMOS results in high production cost.

SUMMARY OF THE INVENTION

The present invention is to provide an IC chip which includes various voltage rating devices concurrently.

The present invention is to provide an IC chip, which includes a switch LDMOS device and an analog LDMOS device concurrently.

The present provides an IC chip, which includes a plurality of LDMOS devices having different voltage ratings, wherein the LDMOS devices are positioned on a substrate of the first conductive type, and the components of each LDMOS device are similar, which include two gate conductive layers, respectively configured on the two first active regions of the substrate. A second conductive type common drain contact region is positioned in a second active region, and the second active region is configured between the plurality first active regions. Further, an isolation structure serves to isolate the above mentioned second active region and the plurality first active regions. The isolation structure between each first active region and the above-mentioned second active region has a length "A" extending along the longitudinal direction of a channel under each gate conductive layer, and each gate conductive layer on each first active region has a length "L" extending along the longitudinal direction of the above channel, and the A/L value of each LDMOS device is different.

According to an embodiment of the invention, in the above-mentioned IC chip, each LDMOS device further includes a second conductive type deep well region, configured in the above substrate. Two second conductive type source contact regions are respectively configured in the above plurality first active regions. Two second conductive type lightly doped source regions are respectively configured in the plurality first active regions and electrically connect with the plurality of source contact regions. Two first conductive type substrate regions are configured in the above plurality first active regions, wherein the two first conductive type substrate regions surround the peripheries of the above source contact regions and of the above plurality lightly doped source regions. Two second conductive type drift regions respectively surround the lower periphery of the above isolation structure between each first active region and each second active region, and are electrically connected with the above drain contact region. Two gate dielectric layers are respectively configured between each conductive layer and each first active region. Moreover, a portion of each gate conductive layer and a portion of the substrate region are coupled to define the above channel region, and respectively extend above the isolation structure to be electrically connected.

According to the embodiments of the present invention, in the above IC chip, the above plurality of LDMOS devices are LDNMOS devices, the first conductive type is P-type and the second conductive type is N-type.

According to the embodiments of the present invention, in the above IC chip, the above plurality of LDMOS devices are LDPMOS devices, the first conductive type is N-type and the second conductive type is P-type.

According to the embodiments of the present invention, in the above IC chip, the plurality of LDMOS devices includes at least one LDNMOS device, wherein the first conductive type in the LDMNOS device is a P-type, and the second conductive type is an N-type. The above plurality LDMOS devices include at least one LDPMOS device, wherein the first conductive type is an N-type, and the second conductive type is a P-type.

According to the embodiments of the present invention, the above IC chip further includes a CMOS device.

According to the embodiments of the present invention, the above IC chip further includes a bipolar device.

According to the embodiments of the present invention, in the above IC chip, the above plurality A/L values ranges from 0.1 to 2. However, A/L value which strongly depends on the technology node and the voltage rating is not limited by this range.

According to the embodiments of the present invention, in the above IC chip, the above isolation structure is a field isolation structure or a shallow trench isolation structure.

The present invention provides an IC chip, which includes a switch LDMOS device and an analog LDMOS device positioned on a first conductive type substrate. The components forming the switch LDMOS device and the analog LDMOS device are similar, which include two gate conductive layers, respectively disposed on the two first active regions of the substrate. The IC chip of the invention also includes two second conductive type common drain contact regions, disposed in the second active region, wherein the second active region is configured in between the two conductive type active regions. Moreover, an isolation structure is included for isolating the above second active region and the above plurality first active regions. The isolation structure between each first active region and the above-mentioned second active region has a length "A" extending along the longitudinal direction of the channel under each gate conductive layer, and each gate conductive layer on each first active region has a length "L" extending along the longitudinal direction of the above channel, and the A/L value of the switch LDMOS device is different from that of the analog LDMOS device.

According to the embodiments of the present invention, in the above IC chip, the A/L value in the switch LDMOS device is smaller than the A/L value in the analog LDMOS device.

According to the embodiments of the present invention, in the above IC chip, the A/L value of the above switch LDMOS device ranges from about 0.33 to about 1.12. According to the embodiments of the present invention, in the above IC chip, the A/L value of the above analog LDMOS device ranges from about 0.54 to about 1.13.

According to the embodiment of the present invention, in the above IC chip, the above switch LDMOS device and the above analog LDMOS device are LDNMOS devices, wherein the first conductive type is P-type, while the second conductive type is an N-type.

According to the embodiment of the present invention, in the above IC chip, the above switch LDMOS device and the above analog LDMOS device are LDPMOS devices, wherein the first conductive type is N-type, while the second conductive type is a P-type.

According to the embodiment of the present invention, in the above IC chip, one of the above switch LDMOS device and the above analog LDMOS device is a LDPMOS device, while the other one is a LDNMOS device. The first conductive type in the LDNMOS device is P-type, while the second conductive type is N-type. The first conductive type in the LDPMOS device is N-type, while the second conductive type is P-type.

According to the embodiment of the present invention, the above IC chip further includes a CMOS device.

According to the embodiment of the present invention, the above IC chip further includes a bipolar device.

According to the embodiment of the present invention, in the above IC chip, the above isolation structure includes a field isolation structure or a shallow trench isolation structure.

In accordance to the present invention, by altering the length "A", that extends along the longitudinal direction of the channel, of the isolation structure between the source contact region and the drain contact region, and the length "L", that extends along the longitudinal direction of the channel, of the gate conductive layer on the active region, devices having different voltage ratings are concurrently formed on the chip.

By relying on a single process and through the change of the photomask pattern, LDMOS devices having different voltage ratings are formed on a same chip. Hence, not only the process is simple, the chip surface area can be more effectively utilized.

By relying on just a single process and through the modification of the photomask pattern to form LDMOS devices, a switch LDMOS device and an analog LDMOS device having different characteristic features are formed on a single chip according to the present invention.

In order to make the aforementioned and other objects, features and advantages of the present invention comprehensible, a preferred embodiment accompanied with figures is described in detail below.

DESCRIPTION OF EMBODIMENTS

Figure 1:
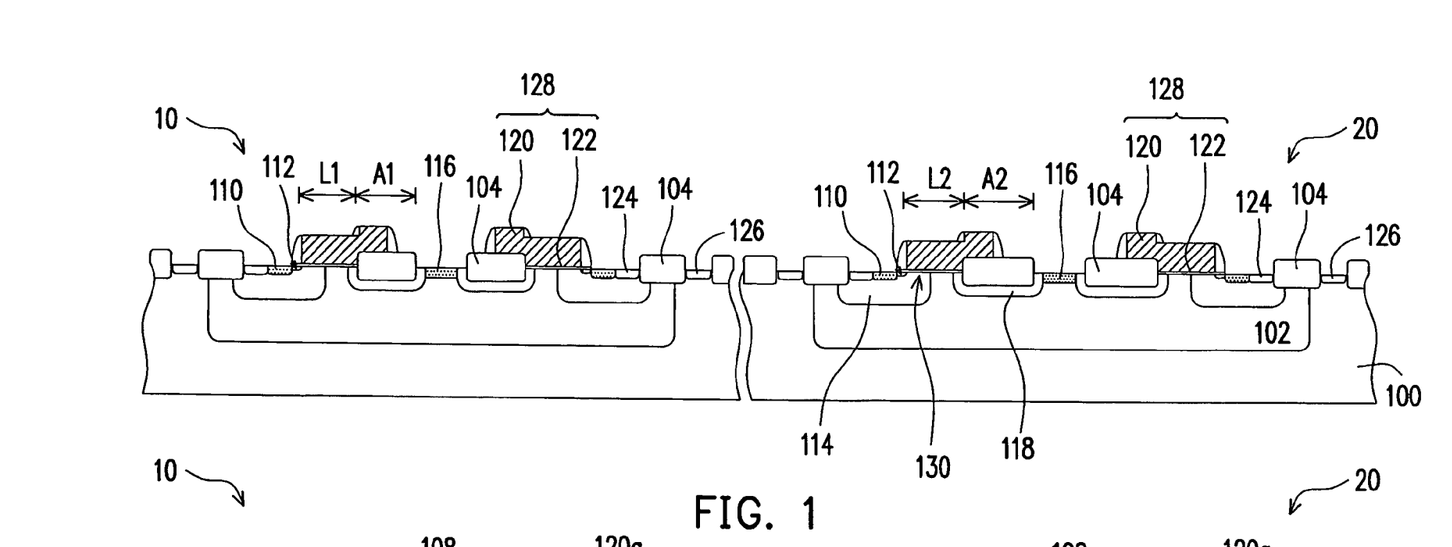
FIG. 1 is a schematic, cross-sectional diagram of an IC chip according to an embodiment of the present invention.
Figure 2:
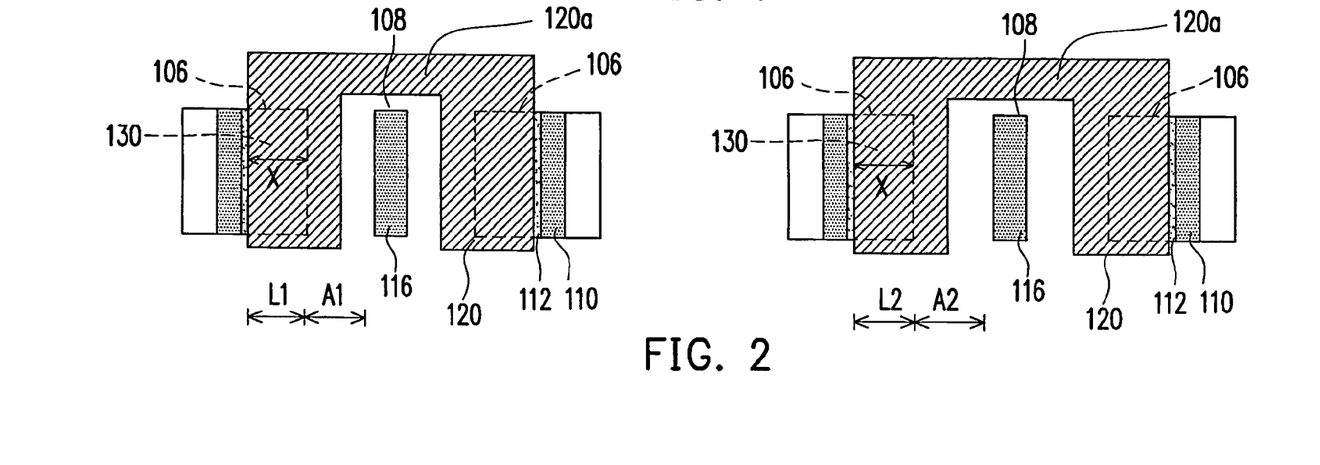
FIG. 2 is a top view of the IC chip shown in FIG. 1.

FIG. 1 is a schematic, cross-sectional diagram of an IC chip according to an embodiment of the present invention. FIG. 2 is a top view of the IC chip shown in FIG. 1.

Referring concurrently to FIGS. 1 and 2, the IC chip of the present invention includes a plurality of LDMOS devices. These LDMOS devices are all LDNMOS devices or all LDPMOS devices, or include a plurality of LDNMOS devices while the remaining is LDPMOS devices. For illustration purposes, the following disclosure is described in terms of two LDMOS devices 10, 20, wherein both LDMOS devices are LDNMOS devices. It should be noted that the two LDMOS devices 10, as shown in FIGS. 1 and 2 are illustrated only as an exemplary example, and should not be adopted for limiting the scope of the present invention.

In this embodiment, the LDNMOS device 10 and the LDNMOS device 20 are respectively configured on a P-type substrate 100 or a P-type well region. In this exemplary example, the LDNMOS device 10 and the LDNMOS device 20 are configured on a P-type well region. The LDNMOS device 10 and the LDNMOS device 20 respectively include two gate structures 128, two N-type source contact regions 110, two N-type lightly doped source regions 112, one N-type common drain contact region 116 and two N-type drift regions 118, configured in the N-type deep well region 102 in the P-type substrate 100. In other words, the LDNMOS device 10 and the LDNMOS device 20 in the deep well region are configured in the two first active regions 106 and the one second active region 108, defined by the isolation structure 104, wherein the second active region 108 is configured between the two first active regions 106.

Each gate structure 128 includes a gate conductive layer 120 and a gate dielectric layer 122. Each gate dielectric layer 122 is configured in the first active region 106 defined by the isolation structure 104. Each gate conductive layer 120 covers each gate dielectric layer 122. In one embodiment, each gate conductive layer 120 further covers the isolation structure 104 between the first active region 106 and the second active region 108. Moreover, one end of the gate conductive layer 120 extends over the isolation structure 104 to electrically connect with the extension section 120a.

Two N-type source contact regions 110 are respectively configured in the first active region 106. To avoid the hot carrier effect, one side of each gate structure 128 respectively includes a lightly N-type lightly doped source region 112, wherein each lightly N-type doped lightly doped source region 112 is electrically connected with each N-type source contact region 110. Each N-type source contact region 110 and each N-type lightly doped source region 112 are surrounded by a P-type body region 114. A portion of the P-type body region 114 is electrically coupled with the gate conductive layer 120 forming a channel region 130.

The N-type common drain contact region 116 is positioned in the second active region. The two N-type drift regions 118 respectively surround the lower periphery of the isolation structure 104 between the first active region 106 and the second active region 108, and electrically connects with the N-type drain contact region 116.

Moreover, each P-type body region 114 respectively includes a P-type pick-up region 124. A P-type guard ring 126 is further included in the substrate 100 outside the N-type deep well region 102.

In the embodiment of the invention, the components that constitute the LDNMOS device 10 and the LDNMOS device 20 are similar; however, the dimensions of some components may be different to provide different characteristic features. For example, in the LDNMOS device 10 and the LDNMOS device 20, the isolation structure 104 between the first active region 106 and the second active region 108 extends along the longitudinal direction of the channel region 130 has lengths respectively represented as A1 and A2. Further, the lengths of the gate conductive layers 120 positioned on the first active region 106 along the X-longitudinal direction of the channel region 130 are respectively L1 and L2. In the embodiment, the A1/L1 value of the LDMOS device 10 is not equal to the A2/L2 value of the LDMOS device 20. A LDMOS with a larger A/L value is obtainable by only modifying the pattern of the photomask by increasing the length A of the isolation structure 104 between the first active region 106 and the second active region 108, or by reducing the length L of the gate conductive layer 120, or by modifying the above-mentioned two parameters concurrently. A LDMOS with a smaller A/L value is obtainable by only modifying the pattern of the photomask, for example, by reducing the length A of the isolation structure 104 between the first active region 106 and the second active region 108, or by increasing the length L of the gate conductive layer 120, or by modifying the above-mentioned two parameters concurrently.

In one embodiment of the invention, both the LDNMOS device 10 and the LDNMOS device 20 are devices having different voltage rating, for example, they are the high voltage devices with two different voltage ratings in the power management IC chip. The source end of the LDNMOS device 10 and the LDNMOS device 20 can sustain a high voltage, and only a small voltage is required to be applied to the gate conductive layer 120 to sustain the high voltage. Hence, the required thickness for the gate dielectric layer 122 is only 100 angstroms to about 200 angstroms. The A/L value of LDNMOS device 10 and that of the LDNMOS device 20 are about 0.1 to 2. However, A/L value which strongly depends on the technology node and the voltage rating is not limited by this range. When the A1/L1 value of the LDNMOS device 10 is smaller than the A2/L2 value of the LDNMOS device 20, the breakdown voltage of the LDNMOS device 10 is lower, which implies the voltage rating of the LDNMOS device 10 is lower and the breakdown voltage of the LDNMOS device 20 is higher, which implies the voltage rating of the LDNMOS device 20 is higher.

The present invention is applicable to territories asides form voltage rating devices, for example, to switch devices or analog devices having different current characteristic requirements concurrently. In one embodiment, the LDNMOS device 10 and the LDNMOS device 20 are respectively a switch device and an analog device. Normally, the switch device requires only a sufficient current generated at the moment of switching to achieve the switching function. Hence, the required saturated current is less, and accordingly, the A1/L1 value of the LDNMOS device 10 is smaller, which is within a range of about 0.33 to about 1.12. On the other hand, the analog device requires a longer stabilized voltage to obviate misjudgment, which implies a larger and stabilized saturated current is required, and in the current vs. voltage curve, a flat saturation region must be present. Accordingly, the A2/L2 value of the LDNMOS device is larger, which is within the range of about 0.54 and 1.13.

Figure 4A:
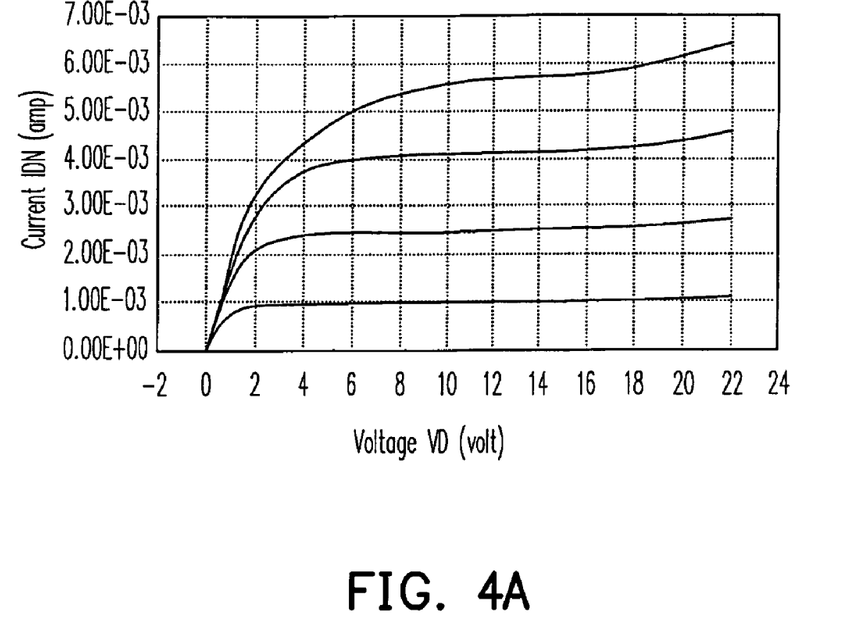
FIGS. 4A and 4B are curves showing the relationships between current and voltage of the switch LDMOS device and the analog LDMOS device according to one embodiment of the present invention.
Figure 4B:
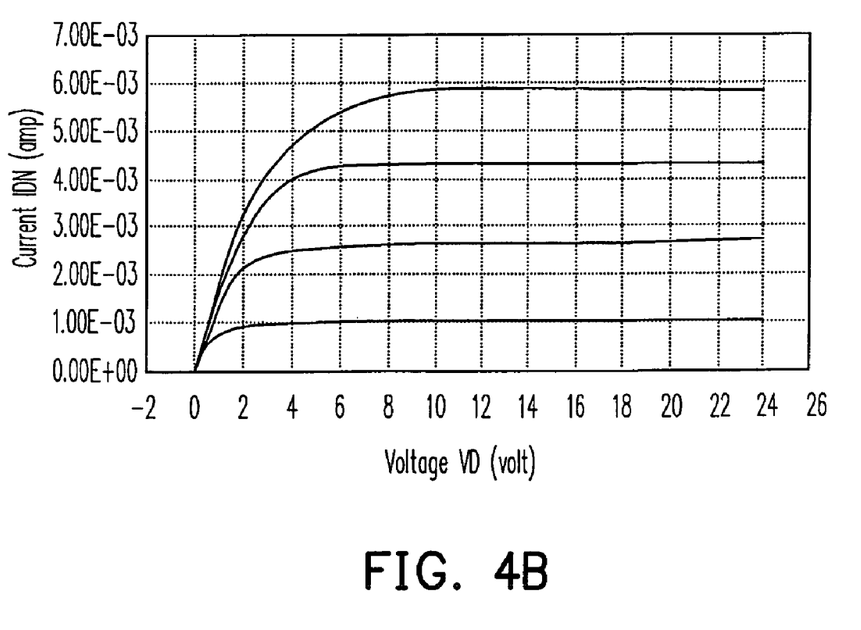

In one embodiment, in the 0.35-micron, 18-volts LDMNOS process, the length (A) of the isolation structure between the source contact region and the drain contact region of the switch LDMOS device on the IC chip is about 0.6 micron; the length (L) of the polysilicon gate on the active region is about 1.8 micron, and A/L=0.333. The length (channel length) of the overlapping region between the P-type substrate region and the polysilicon gate is about 0.5 micron, and the curve showing the relationship between the current and the voltage is illustrated in FIG. 4A. The length (A) of the isolation structure between the source contact region and the drain contact region of the analog LDMOS device on the IC chip is about 1.2 micron; the length (L) of the polysilicon gate on the active region is about 2.2 micron, and A/L=0.545. The length (channel length) of the overlapping region between the P-type substrate region and the polysilicon gate is about 0.5 micron, and the curve showing the relationship between the current and the voltage is shown in FIG. 4B. The results indicate that the breakdown voltage of the switch LDMOS device is about 29.8 volts, and the resistance (RDson) is about 33.0 ohms/cm$^2$. Further, the breakdown voltage of the analog LDMOS device is about 38.3 volts, and the resistance (RDson) is about 50.7 ohms/cm$^2$, and the saturation current curve is very flat.

Figure 5A:
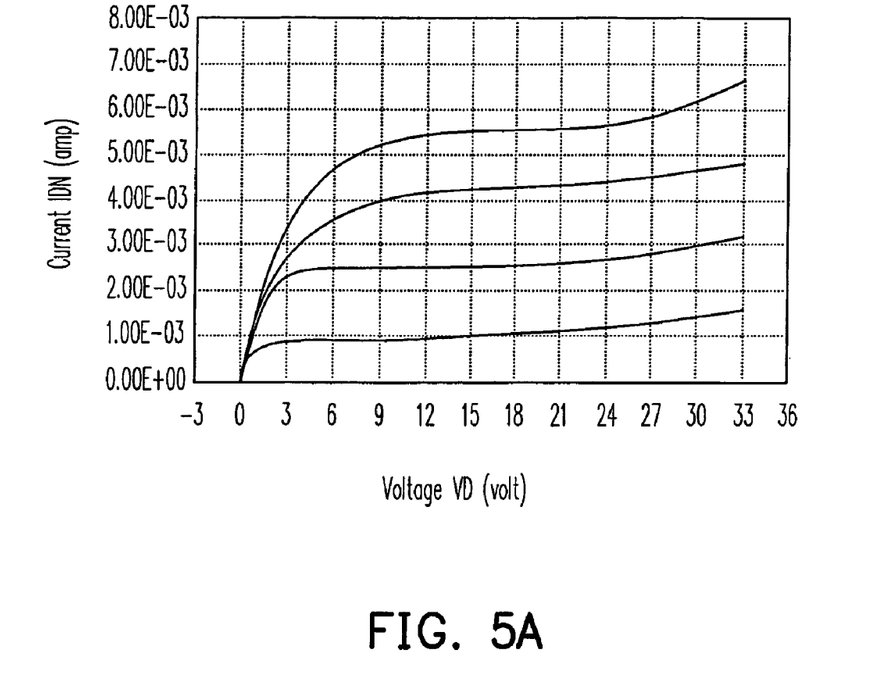
FIGS. 5A and 5B are curves showing the relationships between current and voltage of the switch LDMOS device and the analog LDMOS device according to one embodiment of the present invention.
Figure 5B:
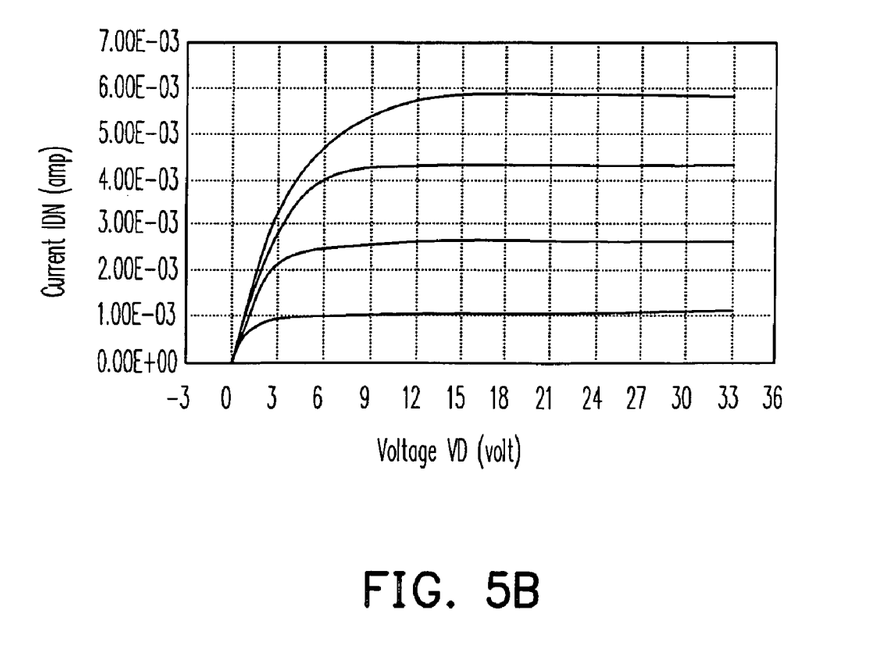

In another embodiment, in the 0.35-micron, 30-volt LDNMOS process, the length (A) of the isolation structure between the source contact region and the drain contact region of the switch LDMOS device on the IC chip is about 1.0 micron; the length (L) of the polysilicon gate on the active region is about 1.6 micron, and A/L=0.625. The length (channel length) of the overlapping region between the P-type substrate region and the polysilicon gate is about 0.5 micron, and the curve showing the relationship between the current and the voltage is illustrated in FIG. 5A. The length (A) of the isolation structure between the source contact region and the drain contact region of the analog LDMOS device on the IC chip is about 1.8 micron; the length (L) of the polysilicon gate on the active region is about 2.2 micron, and A/L=818. The length (channel length) of the overlapping region between the P-type substrate region and the polysilicon gate is about 0.5 micron, and the curve showing the relationship between the current and the voltage is illustrated in FIG. 5B. The results indicate that the breakdown voltage of the switch LDMOS device is about 37.7 volts, and the resistance (RDson) is about 37.7 ohms/cm$^2$. The breakdown voltage of the analog LDMOS device is about 39.1 volts, and the resistance (RDson) is about 62.9 ohms/cm$^2$, and the saturation current curve is very flat.

Figure 6A:
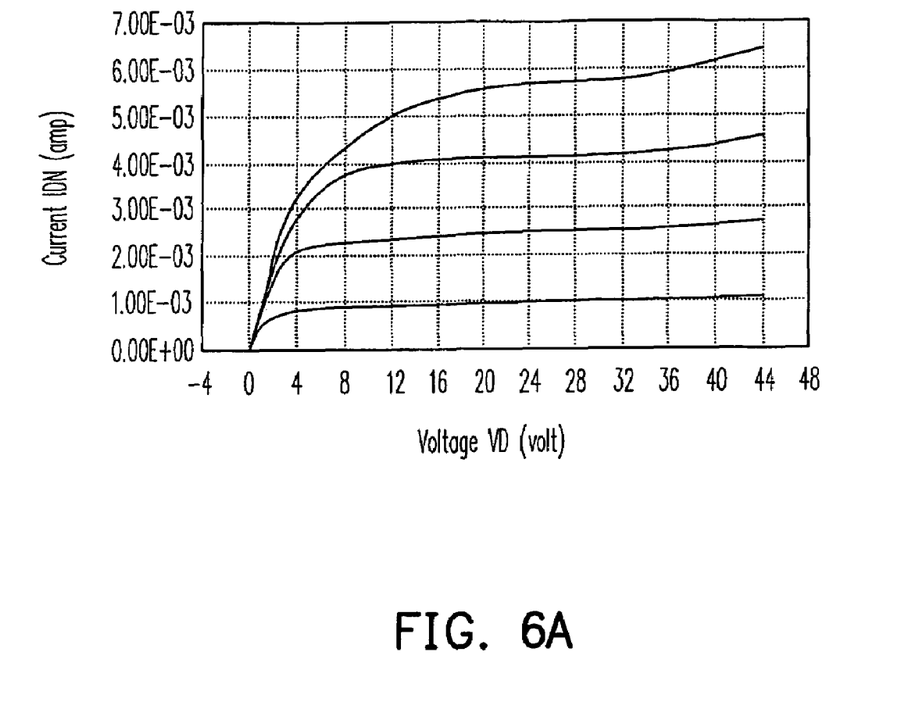
FIGS. 6A and 6B are curves showing the relationships between current and voltage of the switch LDMOS device and the analog LDMOS device according to one embodiment of the present invention
Figure 6B:
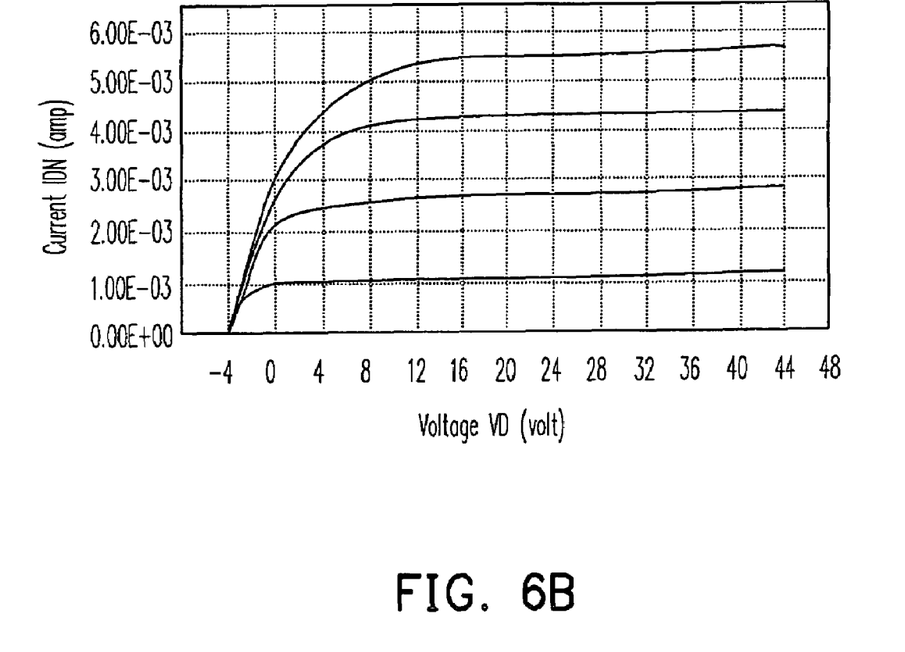

In another embodiment, in the 0.35-micron, 40-volt LDNMOS process, the length (A) of the isolation structure between the source contact region and the drain contact region of the switch LDMOS device on the IC chip is about 1.8 micron; the length (L) of the polysilicon gate on the active region is about 1.6 micron, and A/L=1.125. The length (channel length) of the overlapping region between the P-type substrate region and the polysilicon gate is about 0.5 micron, and the curve showing the relationship between the current and the voltage is illustrated in FIG. 6A. The length (A) of the isolation structure between the source contact region and the drain contact region of the analog LDMOS device on the IC chip is about 2.5 micron; the length (L) of the polysilicon gate on the active region is about 2.2 micron, and A/L=0.5. The length (channel length) of the overlapping region between the P-type substrate region and the polysilicon gate is about 0.5 micron, and the curve showing the relationship between the current and the voltage is illustrated in FIG. 6B. The results indicate that the breakdown voltage of the switch LDMOS device is about 49.7 volts, and the resistance (RDson) is about 60.2 ohms/cm$^2$. The breakdown voltage of the analog LDMOS device is about 53.3 volts, and the resistance (RDson) is about 85.7 ohms/cm$^2$, and the saturation current curve is very flat.

Although the foregoing description of the preferred embodiment of the present invention has been presented by using a LDNMOS devices as the devices 10, 20, LDPMOS device can be actually applied as devices 10, 20, and are within the scope of the present invention. If the P-type in the above LDNMOS device is a first conductive type and the N-type represents the second conductive type, in the LDPMOS device, the first conductive type is an N-type and the second conductive type is the P type.

Similarly, the devices 10, 20 are respectively LDNMOS device and LDPMOS device. If the P-type in the LDNMOS device represents the first conductive type and the N-type is the second conductive type, in the LDPMOS device, the first conductive type is an N-type and the second conductive is a P-type.

Figure 3:
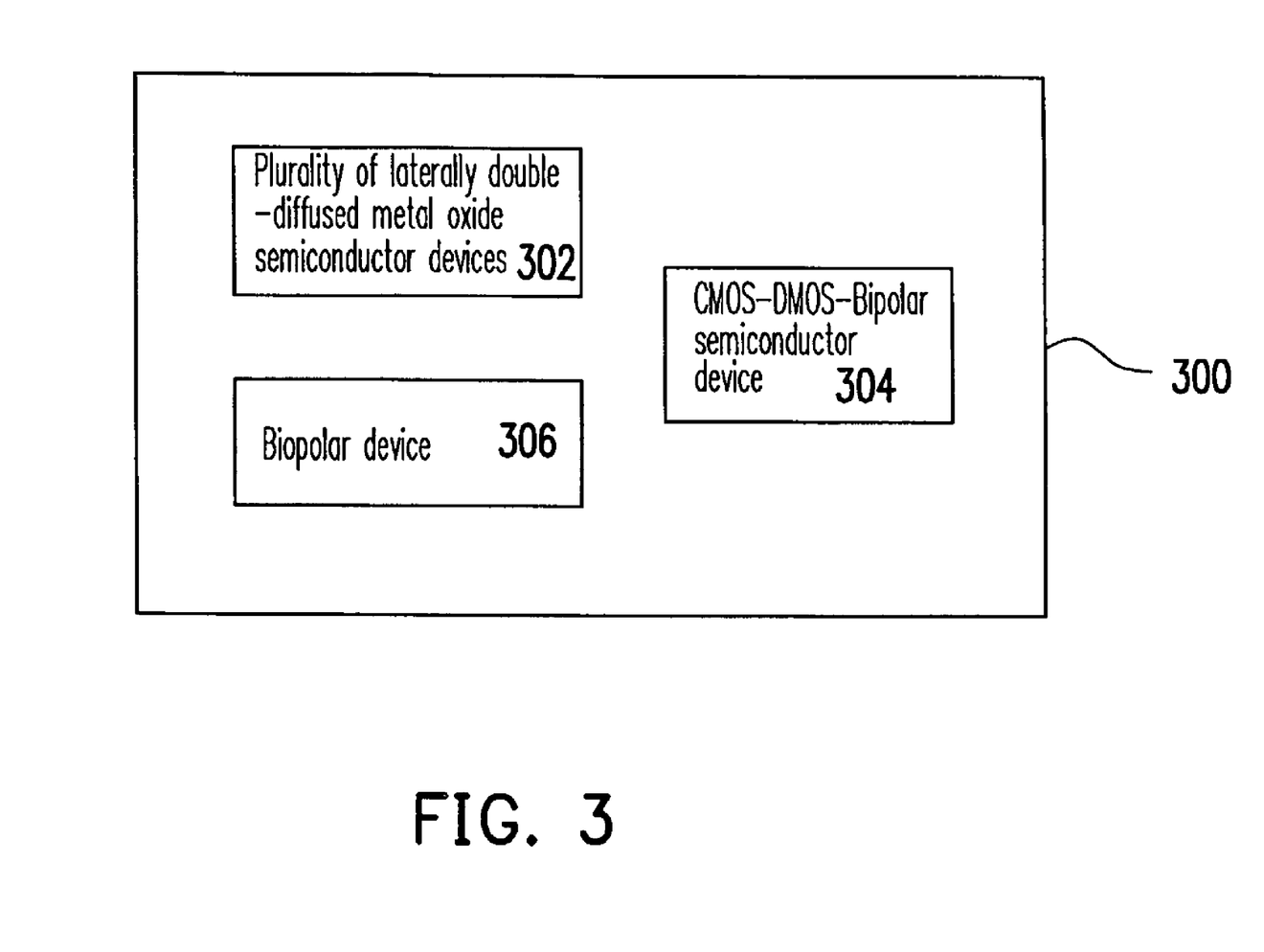
FIG. 3 is a schematic, cross-sectional diagram of an IC chip according to an embodiment of the present invention.

Further referring to FIG. 3, in an actual application, the IC chip 300 asides from including a plurality of different LDMOS devices 302, other devices may be included, such as, a CMOS device 304 or a bipolar device 306.

The present invention relies on a single process and through the modification of the photomask pattern to form LDMOS devices with different characteristics on a same chip. Hence, not only the process is simple, the chip surface area can be more effectively utilized. Moreover, the present invention relies on a single process and through the modification of the photomask pattern or the increase of the number of the photomask to form switch devices and analog devices with different characteristic requirements on a single chip.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An integrated circuit chip comprising:
    a plurality of LDMOS (laterally double-diffused metal oxide semiconductor) devices having different voltage ratings, wherein the LDMOS devices are configured on a substrate having a first conductive type, and each LDMOS device is constructed with components comprises:
    two gate conductive layers, respectively disposed on two first active regions of the substrate;
    a common drain contact region having a second conductive type, wherein the common drain contact region is configured in a second active region, and the second active region is configured between the first active regions;
    an isolation structure, isolating the second active region and the first active regions;
        wherein the isolation structure between each of the first active regions and the second active region has a length "A" extending along a longitudinal direction of a channel under each of the two gate conductive layers, and each of the two gate conductive layers on each of the two first active regions has a length "L" extending along the longitudinal direction of the above channel, the LDMOS devices having different voltage ratings comprise different A/L values.

2. The integrated circuit chip of claim 1, wherein each of the plurality of the LDMOS devices further comprises:
    a deep well region having the second conductive type, wherein the deep well region is configured in the substrate;
    two source contact regions having the second conductive type, wherein the two source contact regions are respectively configured in the first active regions;
    two lightly doped source regions having the second conductive type, wherein the two lightly doped source regions are respectively configured in the first active region and are electrically connected with the source contact region;
    two substrate regions having the first conductive type, wherein the two substrate regions are configured in the first active regions, surrounding the source contact region and a periphery of the lightly doped source region;
    two drift regions having the second conductive type, respectively surrounding a lower periphery of the isolation structure between each of the first active regions and the second active region, and is electrically connected with the drain contact region; and
    two gate dielectric layers, respectively disposed between each of the gate conductive layers and each of the first active regions,
        wherein a portion of each of the gate conductive layers is coupled to a portion of each of the substrate regions to define the channel, and respectively extends to above the isolation structure to be electrically connected.

3. The integrated circuit chip of claim 1, wherein the LDMOS devices are respectively LDNMOS devices, and the first conductive type is a P-type, while the second conductive type is an N-type.

4. The integrated circuit chip of claim 1, wherein the LDMOS devices are respectively LDPMOS devices, and the first conductive type is an N-type, while the second conductive type is a P-type.

5. The integrated circuit chip of claim 1, wherein
    at least one of the LDMOS devices is a LDNMOS device, and the first conductive type in the LDNMOS device is a P-type, and the second conductive type is the N-type; and
    at least another one of the LDMOS devices is a LDPMOS device, and the first conductive type is the N-type, and the second conductive type is the P-type.

6. The integrated circuit chip of claim 1 further comprising a CMOS device.

7. The integrated circuit chip of claim 1 further comprising a bipolar device.

8. The integrated circuit chip of claim 1, wherein the different A/L value ranges from about 0.1 to about 2.

9. The integrated circuit chip of claim 1, wherein the isolation structure is a field isolation structure or a shallow trench isolation structure.

10. An IC (integrated circuit) chip, comprising:
a switch LDMOS device and an analog LDMOS device, configured on a substrate having a first conductive type, wherein the switch LDMOS device and the analog LDMOS device are constructed with similar components, which are respectively comprise:
two gate conductive layers, respectively disposed on two active regions of the substrate;
a common drain contact region having a second conductive type, disposed in a second active region, wherein the second active region is configured between the first active regions;
an isolation structure for isolating the second active region and the first active regions,
wherein the isolation structure between each of the first active regions and the second active region has a length "A" extending along a longitudinal direction of a channel under each gate conductive layer, and each gate conductive layer on each first active region has a length "L" extending along the longitudinal direction of the above channel, the switch LDMOS device and the analog LDMOS device comprise different A/L values.

11. The IC chip of claim 10, wherein the switch LDMOS device and the analog LDMOS device respectively comprise:
a deep well region comprising the second conductive type, wherein the deep well region is configured in the substrate;
two source contact regions comprising the second conductive type, wherein the two source contact regions are respectively configured in the first active regions;
two lightly doped source regions comprising the second conductive type, wherein the two lightly doped source regions are configured in the first active regions electrically connected with the source contact regions;
two substrate regions comprising the first conductive type, where the two substrate regions are configured in the first active regions, surrounding the source contact regions and a periphery of the lightly doped source regions;
two drift regions comprising the second conductive type, respectively surrounding a lower periphery of the isolation structure between each first active regions and the second region, and electrically connected with the drain contact region; and
two gate dielectric layer, respectively configured between each gate conductive layer and each first active region, wherein a portion of each of the gate conductive layer is electrically coupled with a part of each of the substrate region to define a channel region, and respectively extends above the isolation structure to be electrically connected.

12. The IC chip of claim 10, wherein the A/L value of the switch LDMOS device is smaller than the A/L value of the analog LDMOS device.

13. The IC chip of claim 12, wherein the A/L value of the switch LDMOS device ranges from about 0.33 to about 1.12.

14. The IC chip of claim 12, wherein the A/L value of the analog LDMOS device ranges from about 0.54 to about 1.13.

15. The IC chip of claim 10, wherein the switch LDMOS device and the analog LDMOS device are respectively LDNMOS devices, and the first conductive is a P type, while the second conductive type is an N-type.

16. The IC chip of claim 10, wherein the switch LDMOS device and the analog LDMOS device are respectively LDPMOS devices, and the first conductive is an N-type, while the second conductive type is a P-type.

17. The IC chip of claim 10, wherein one of the switch LDMOS device and the analog LDMOS device is a LDNMOS device and another one is a LDPMOS device, wherein
the first conductive type in the LDNMOS device is a P-type, and the second conductive is an N type; and
the first conductive type in the LDPMOS device is an N-type, and the second conductive type is a P-type.

18. The IC chip of claim 10 further comprising a CMOS device.

19. The IC chip of claim 10 further comprising a bipolar device.

20. The IC chip of claim 10, wherein the isolation structure is a field isolation structure or a shallow trench isolation structure.

* * * * *